(12) United States Patent
Morimoto et al.

(10) Patent No.: US 7,612,379 B2
(45) Date of Patent: Nov. 3, 2009

(54) MULTI-GATE THIN FILM TRANSISTOR HAVING RECRYSTALLIZED CHANNEL REGIONS WITH DIFFERENT GRAIN SIZES

(75) Inventors: Yoshihiro Morimoto, Hsinchu (TW); Ryan Lee, Hualien (TW); Hanson Liu, Kaohsiung (TW); Fengyi Chen, Pingtung (TW)

(73) Assignee: TPO Displays Corp., Chu-Nan, Miao-Li County (TW)

( * ) Notice: Subject to any disclaimer, the term of this patent is extended or adjusted under 35 U.S.C. 154(b) by 18 days.

(21) Appl. No.: 11/938,117

(22) Filed: Nov. 9, 2007

(65) Prior Publication Data

US 2008/0128704 A1   Jun. 5, 2008

(30) Foreign Application Priority Data

Nov. 30, 2006   (TW) ............................... 95144371 A

(51) Int. Cl.
  *H01L 29/786* (2006.01)
(52) U.S. Cl. ............................... 257/74; 257/75; 257/72; 257/66; 438/486; 438/488; 438/166; 438/149
(58) Field of Classification Search ............. 349/41–43, 349/46, 73, 74, 92, 139, 140, 160; 438/142, 438/149, 151, 166, 486–489; 257/72–75, 257/110, 190, 316–318, 365, 512, 548–550, 257/553, 563, 564, 600, 627, 628, 647
See application file for complete search history.

(56) References Cited

U.S. PATENT DOCUMENTS

| 5,272,369 A | * | 12/1993 | Colinge et al. ............... 257/352 |
| 5,471,330 A | * | 11/1995 | Sarma .......................... 349/43 |
| 6,204,534 B1 | * | 3/2001 | Adan .......................... 257/347 |
| 6,602,765 B2 | | 8/2003 | Jiroku et al. |
| 6,815,269 B2 | | 11/2004 | Okumura |
| 2004/0016926 A1 | * | 1/2004 | Wolfe et al. .................... 257/66 |
| 2005/0277236 A1 | * | 12/2005 | Shimomura et al. .......... 438/166 |

FOREIGN PATENT DOCUMENTS

| JP | 05-289103 | * | 5/1993 |
| JP | 09-082969 | * | 3/1997 |

* cited by examiner

Primary Examiner—N Drew Richards
Assistant Examiner—Morgan Varner
(74) Attorney, Agent, or Firm—Birch, Stewart, Kolasch & Birch, LLP

(57) ABSTRACT

An image display system has a multi-gate thin film transistor (TFT) disposed on a transparent substrate. The multi-gate TFT includes a silicon film layer, a first electrode and a reflecting layer. The silicon film layer is formed on the transparent substrate and has a first crystallization zone and a second crystallization zone, which are not adjacent to each other. A grain size of the first crystallization zone is smaller than a grain size of the second crystallization zone. The first electrode corresponding to the first crystallization zone is disposed on the silicon film layer. The reflecting layer corresponding to the second crystallization zone is disposed on the transparent substrate. The silicon film layer is disposed on the transparent substrate and the reflecting layer.

15 Claims, 6 Drawing Sheets

MULTI-GATE THIN FILM TRANSISTOR HAVING RECRYSTALLIZED CHANNEL REGIONS WITH DIFFERENT GRAIN SIZES

CROSS REFERENCE TO RELATED APPLICATIONS

This Non-provisional application claims priority under 35 U.S.C. §119(a) on Patent Application No(s). 095144371 filed in Taiwan, Republic of China on Nov. 30, 2006, the entire contents of which are hereby incorporated by reference.

BACKGROUND OF THE INVENTION

1. Field of Invention

The invention relates to an image display system and a manufacturing method, and, in particular, to an image display system with a multi-gate TFT and a method of manufacturing the multi-gate TFT.

2. Related Art

Active matrix display type image display systems include an active matrix liquid crystal display (LCD) device and an active matrix organic light emitting diode display device, for example. A thin-film transistor (TFT) is disposed in a pixel of the active matrix display device, so the number of color levels and the frame holding ability, which may be controlled in the active matrix display device, are higher than those of a passive matrix display type image display system, and the better display effect can be provided.

The element property of the TFT influences the display quality of the image frame. The prior art utilizes an excimer laser to anneal a silicon film layer of the TFT so that the silicon film layer is recrystallized into polysilicon. Thus, the polysilicon TFT has the higher electron mobility, the lower threshold voltage, the stabler saturation property and the lower power consumption, and can integrate a pixel array and a driving circuit on the same glass substrate, or even integrate the whole image display system on the same glass substrate.

FIG. 1 shows a relationship between a drain-source voltage and a drain-source current in a conventional TFT. As shown in FIG. 1, the TFT structure is a floating body structure. So, when the voltage difference between the drain and source is too high, the TFT is influenced by the kink current and thus has the poor stability. The kink current is generated due to the increase of the potential energy of the body caused by the accumulated holes in the source. Thus, the behavior between the body and the source is similar to a parasitic bipolar junction transistor (BJT). If the electric field of the body becomes stronger, the turn-on current (i.e., the kink current) becomes higher.

FIG. 2 is a schematic illustration showing a conventional dual-gate TFT. As shown in FIG. 2, the related art utilizes a dual-gate structure to case the influence caused by the too-high voltage difference between the drain and source and to lower the kink current. A conventional TFT 1 is configured to be composed of two sub-TFTs T1 and T2. The TFT 1 includes a silicon film layer 10 and a metal layer 16, which serves as a gate of the TFT 1. The gate includes two interdigitated gate electrodes 161 and 162 respectively serving as gates of the sub-TFTs T1 and T2. The silicon film layer 10 is doped to form three doped regions 11, 12 and 13. The doped regions 11 and 13 respectively serve as the source and the drain of the sub-TFT T1, while the doped regions 12 and 13 respectively serve as the drain and source of the sub-TFT T2. Taking the TFT 1 as a whole, the doped regions 11 and 12 respectively serve as the source and drain of the TFT 1. In addition, channel regions 14 and 15 of the sub-TFTs T1 and T2 are formed corresponding to the gate electrodes 161 and 162 in the silicon film layer 10. Under this architecture, the potential difference between the drain and source in each of the sub-TFTs T1 and T2 will be lower than that of the original single-gate TFT. Thus, the kink current of each of the sub-TFTs T1 and T2 is thus lower, so the kink current of the overall TFT 1 is also improved. As for a high-efficiency image display system, however, the efficiency of the image display system can be further enhanced if the kink current of the TFT can be further lowered.

Therefore, it is an important subject to provide an image display system and a method of manufacturing a multi-gate TFT.

SUMMARY OF THE INVENTION

In view of the foregoing, the invention is to provide an image display system and a method of manufacturing a multi-gate TFT in order to lower a kink current of the TFT.

To achieve the above, the invention discloses an image display system having a multi-gate thin-film transistor (TFT) disposed on a transparent substrate. The multi-gate TFT includes a silicon film layer, a first electrode and a reflecting layer. The silicon film layer is formed on the transparent substrate and has a first crystallization zone and a second crystallization zone that are not adjacent to each other. The grain size of the first crystallization zone is smaller than that of the second crystallization zone. The first electrode corresponds to the first crystallization zone and is disposed on the silicon film layer. The reflecting layer corresponds to the second crystallization zone and is disposed on the transparent substrate. The silicon film layer is disposed on the transparent substrate and the reflecting layer.

To achieve the above, the invention also discloses a method of manufacturing a multi-gate thin-film transistor (TFT) including the flowing steps. First, a reflecting layer is formed on a transparent substrate. Next, a silicon film layer is formed on the transparent substrate and the reflecting layer. The silicon film layer has a first crystallization zone and a second crystallization zone corresponding to the reflecting layer. Then, a laser beam having a wavelength longer than 400 nanometers illuminates on the silicon film layer. Accordingly, the silicon film layer absorbs a portion of the laser beam and is thus heated to melt, and the other portion of the laser beam penetrates through the second crystallization zone of the silicon film layer and is reflected from the reflecting layer to the silicon film layer. Thus, the second crystallization zone of the silicon film layer absorbs the reflected laser beam and is heated and recrystallized. After that, a gate insulating layer is formed on the silicon film layer. Finally, a first electrode, which corresponds to the first crystallization zone, is formed on the gate insulating layer.

As mentioned above, in the image display system and the method of manufacturing the multi-gate TFT according to the invention, the second crystallization zone has better conductivity than the first crystallization zone and the second crystallization zone has smaller equivalent resistance than the first crystallization zone. So, when the multi-gate TFT operates, the same current flows through the second crystallization zone and the first crystallization zone. However, the second crystallization zone has the smaller potential difference than the first crystallization zone, so that the kink current generated in the second crystallization zone can be reduced.

In one of the preferred embodiments, the multi-gate TFT includes a first sub-TFT and a second sub-TFT. Herein, the first crystallization zone serves as a channel region of the first sub-TFT, and the second crystallization zone serves as a channel region of the second sub-TFT. Moreover, the first sub-TFT operates in an active region, and the second sub-TFT operates in a saturation region.

As mentioned above, the second sub-TFT operates in the saturation region to make the voltage difference between the drain and source be smaller Consequently, the kink current of the second sub-TFT is greatly reduced. In addition, the two sub-TFTs are cascaded and have the same current flowing therethrough. So, improving the current of the second sub-TFT can improve the current of the overall multi-gate TFT so that the multi-gate TFT cannot be easily influenced by the kink current, and the current stability is thus enhanced.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
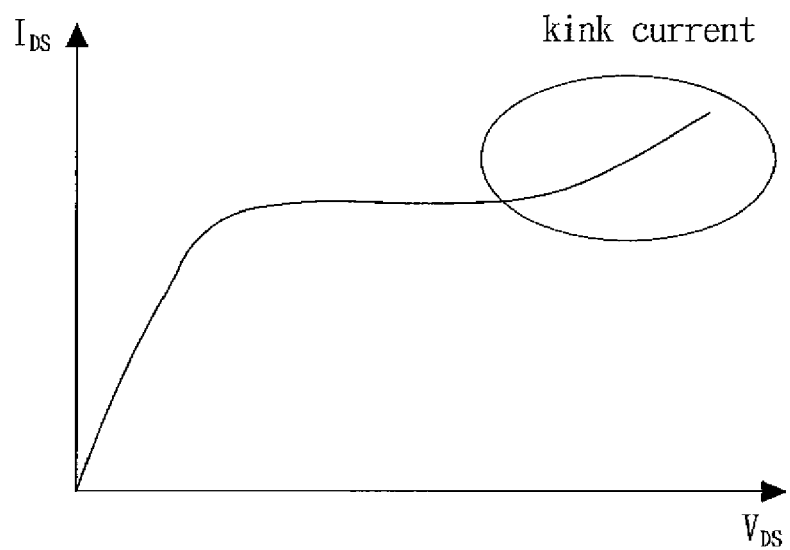
FIG. 1 shows a relationship between a drain-source voltage and a drain-source current in a conventional TFT.
Figure 2:
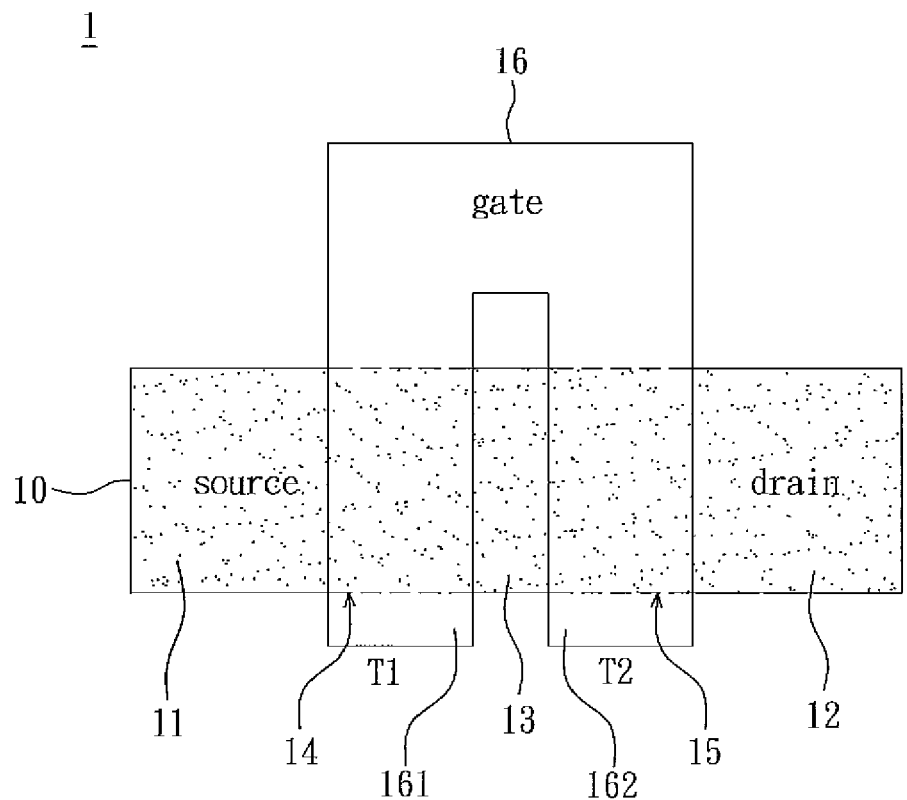
FIG. 2 is a schematic illustration showing a conventional dual-gate TFT.
Figure 3A:
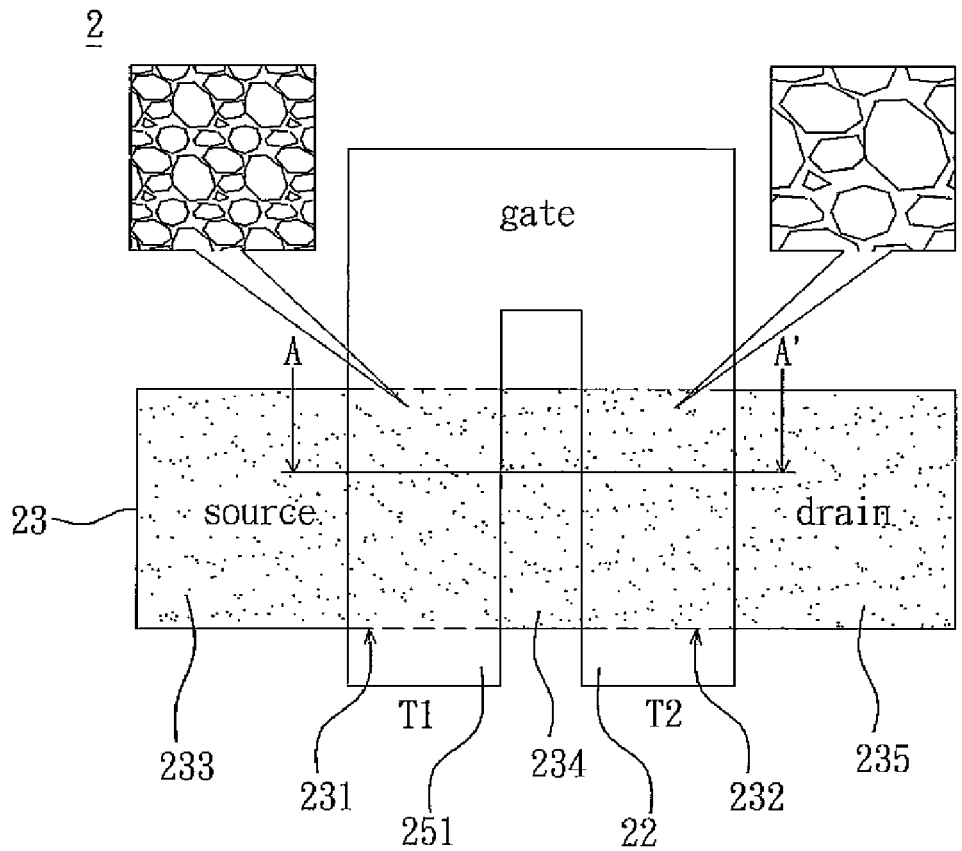
FIG. 3A is a top view showing a multi-gate TFT in an image display system according to a preferred embodiment of the invention.
Figure 3B:
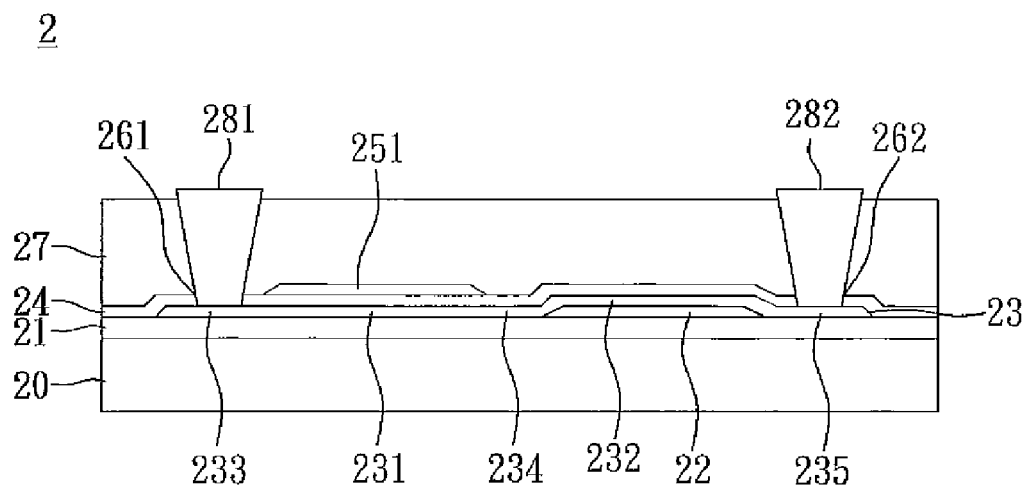
FIG. 3B is a cross-sectional view taken along a line AA' in FIG. 3A.

FIG. 3A is a top view showing a multi-gate TFT in an image display system according to a preferred embodiment of the invention. FIG. 33 is a cross-sectional view taken along a line AA' in FIG. 3A. Referring to FIGS. 3A and 3B, the image display system has a multi-gate thin-film transistor (TFT) 2 disposed on a transparent substrate 20, which includes a silicon film layer 23, a first electrode 251 and a reflecting layer 22. The silicon film layer 23 is formed on the transparent substrate 20 and has a first crystallization zone 231 and a second crystallization zone 232, which are not adjacent to each other. A grain size of the first crystallization zone 231 is smaller than that of the second crystallization zone 232. The first electrode 251 corresponding to the first crystallization zone 231 is disposed on the silicon film layer 23. The reflecting layer 22 corresponding to the second crystallization zone 232 is disposed on the transparent substrate 20. The silicon film layer 23 is disposed on the transparent substrate 20 and the reflecting layer 22.

As shown in FIG. 3B, the multi-gate TFT 2 of this embodiment further includes a buffer layer 21 and a gate insulating layer 24. The buffer layer 21 is disposed on the transparent substrate 20, and the silicon film layer 23 is disposed on the buffer layer 21. The gate insulating layer 24 is disposed on the silicon film layer 23, and the first electrode 251 is disposed on the gate insulating layer 24. The silicon film layer 23 further includes a first doped region 233, a second doped region 234 and a third doped region 235. The first doped region 233 is disposed near the first crystallization zone 231 to serve as a source of the multi-gate TFT 2. The second doped region 234 is disposed between the first crystallization zone 231 and the second crystallization zone 232. The third doped region 235 is disposed near the second crystallization zone 232 to serve as a drain of the multi-gate TFT 2.

An insulating layer 27 is disposed on the silicon film layer 23 and the first electrode 251. A via 261 connects the first doped region 233 with a conductive electrode 281, while a via 262 connects the third doped region 235 with a conductive electrode 282.

The multi-gate TFT 2 includes a first sub-TFT T1 and a second sub-TFT T2. The first electrode 251 serves as a gate of the first sub-TFT T1, and the reflecting layer 22 serves as a gate of the second sub-TFT T2. The first crystallization zone 231 serves as a channel region of the first sub-TFT T1, and the second crystallization zone 232 serves as a channel region of the second sub-TFT T2.

During the manufacturing process, the silicon film layer 23 is illuminated by a laser beam having a wavelength longer than 400 nanometers. Consequently, the silicon film layer 23 absorbs a portion of the laser beam and is thus heated to melt. In addition, the other portion of the laser beam penetrates through the second crystallization zone 232 of the silicon film layer 23 and then is reflected from the reflecting layer 22 to the silicon film layer 23 so that the second crystallization zone 232 of the silicon film layer 23 absorbs the reflected laser beam and is heated to recrystallize. Thus, the second crystallization zone 232 absorbs more laser beams than the first crystallization zone 231, and thus has longer melting period than the first crystallization zone 231 so that the grain size thereof is greater than that of the first crystallization zone 231.

In this embodiment, the transparent substrate 20 is a glass substrate, each of the first electrode 251 and the reflecting layer 22 is made of a metal material, the reflecting layer 22 has a thickness greater than 100 angstroms, and the material of the silicon film layer 23 after laser annealing turns from the amorphous silicon to the polysilicon.

Because the grain size of the second crystallization zone 232 is larger, the second crystallization zone 232 has better conductivity than the first crystallization zone 231. The equivalent resistance of the second crystallization zone 232 is smaller than that of the first crystallization zone, so the first sub-TFT T1 operates in the active region and the second sub-TFT T2 operates in the saturation region when the multi-gate TFT 2 is operating.

The currents flowing through the two sub-TFTs T1 and T2 are the same. The current $I_{TFT1}$ of the first sub-TFT T1 may be calculated according to Equation (1), and the current $I_{TFT2}$ of the second sub-TFT T2 may be calculated according to Equation (2):

$$I_{TFT1}(\text{linear}) = k_{TFT1}(2(V_G - V_T)V_{Float} - V_{Float}^2) \qquad (1),$$

and $$I_{TFT2}(\text{saturation}) = k_{TFT2}(V_G - V_{Float} - V_T)^2 \qquad (2),$$

wherein $I_{TFT1}$ denotes the current of the first sub-TFT T1, $I_{TFT2}$ denotes the current of the second sub-TFT T2, $V_G$ denotes the gate voltage, $V_{Float}$ denotes the voltage in the second doped region, $V_T$ denotes the thermal voltage, $k_{TFT1}$ denotes the transconductance coefficient of the first sub-TFT T1, and $k_{TFT2}$ denotes the transconductance coefficient of the second sub-TFT T2.

If the voltage $V_{Float}$ of the second doped region 234 is increased such that the voltage difference between the drain and the source of the second sub-TFT T2 is decreased, the kink current of the second sub-TFT T2 can be suppressed. The voltage $V_{Float}$ of the second doped region may be calculated according to Equation (3), which combines Equations (1) and (2):

$$V_{Float} = \left(1 - \sqrt{\frac{k_{TFT1}}{k_{TFT1} + k_{TFT2}}}\right)(V_G - V_T), \quad (3)$$

wherein the transconductance coefficients $k_{TFT1}$ and $k_{TFT2}$ are defined as Equation (4) and (5):

$$k_{TFT1} = \frac{W_1 \cdot \mu_1 \cdot C_{ox}}{2L_1}, \text{ and} \quad (4)$$

$$k_{TFT2} = \frac{W_2 \cdot \mu_2 \cdot C_{ox}}{2L_2}, \quad (5)$$

wherein $W_1$ denotes the width of the channel region of the first sub-TFT T1, $L_1$ denotes the length of the channel region of the first sub-TFT T1, $\mu_1$ denotes the mobility of the first sub-TFT T1, $W_2$ denotes the width of the channel region of the second sub-TFT T2, $L_2$ denotes the length of the channel region of the second sub-TFT T2, $\mu_2$ denotes the mobility of the second sub-TFT T2 and $C_{ox}$ denotes the capacitance of the gate unit.

Because the crystallization particle of the second crystallization zone 232 is larger than that of the first crystallization zone 231, the mobility $\mu_2$ of the second sub-TFT T2 is greater than the mobility $\mu_1$ of the first sub-TFT T1. If the two sub-TFTs T1 and T2 have the same width-to-length ratio (W/L), the transconductance coefficient $k_{TFT2}$ of the second sub-TFT T2 is greater than the transconductance coefficient $k_{TFT1}$ of the first sub-TFT T1. Consequently, the voltage $V_{Float}$ of the second doped region 234 can be increased. So, the voltage difference between the drain and the source of the second sub-TFT T2 is smaller so that the kink current of the second sub-TFT T2 can be suppressed.

In addition, the two sub-TFTs T1 and T2 are cascaded and thus have the same current. Consequently, improving the current of the second sub-TFT T2 can improve the current of the overall multi-gate TFT 2 so that the multi-gate TFT 2 cannot be easily influenced by the kink current and the current stability thereof can be thus enhanced.

On the other hand, a width-to-length ratio of the channel region of the first sub-TFT T1 may be configured to be smaller than a width-to-length ratio of the channel region of the second sub-TFT T2 in order to increase the difference between the transconductance coefficients of the two sub-TFTs T1 and T2, and the voltage $V_{Float}$ of the second doped region 234 can be further increased. Alternatively, the two sub-TFTs T1 and T2 have the same width of the channel region, the difference between the transconductance coefficients of the two sub-TFTs T1 and T2 can be increased and the voltage $V_{Float}$ of the second doped region 234 can be increased if the length of the first crystallization zone 231 is configured to be greater than that of the second crystallization zone 232.

Figure 4A:
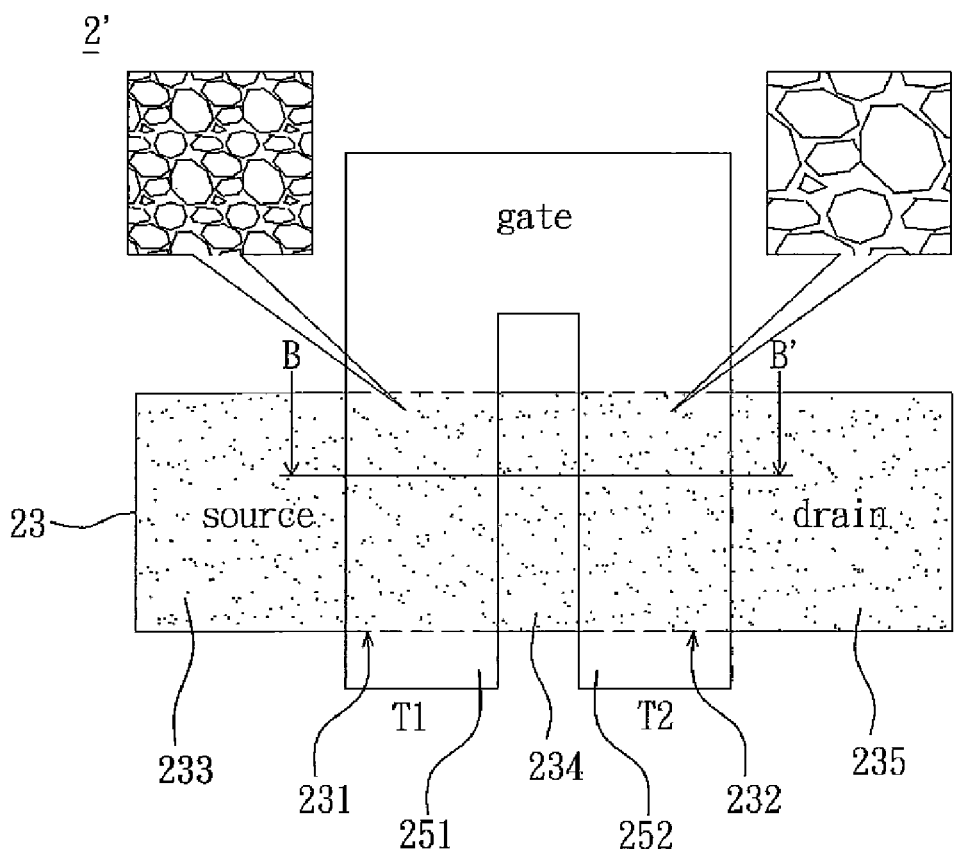
FIG. 4A is a top view showing a multi-gate TFT in an image display system according to another preferred embodiment of the invention.
Figure 4B:
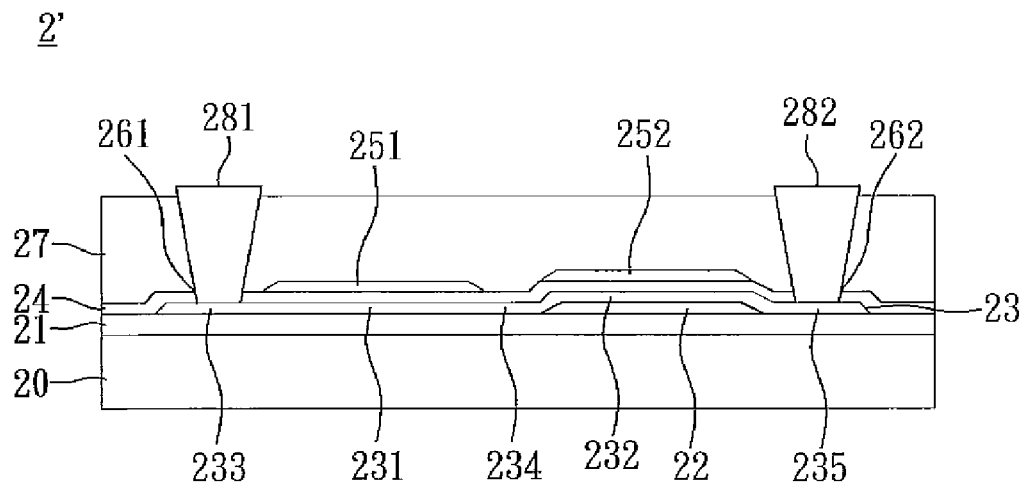
FIG. 4B is a cross-sectional view taken along a line BB' in FIG. 4A.

FIG. 4A is a top view showing a multi-gate TFT 2' in an image display system according to another preferred embodiment of the invention. FIG. 4B is a cross-sectional view taken along a line BB' in FIG. 4A. As shown in FIGS. 4A and 4B, what is different from those described in FIGS. 3A and 3B is that the multi-gate TFT 2' further includes a second electrode 252, which corresponds to the second crystallization zone 232 and is disposed on the silicon film layer 23.

The first electrode 251 may serve as the gate of the first sub-TFT T1, and the second electrode 252 may serve as the gate of the second sub-TFT T2. The reflecting layer 22 may also serve as the gate of the second sub-TFT T2, or may not serve as the gate of the second sub-TFT T2 but function to block and reflect the light.

FIGS. 5A to 5E are schematic illustrations showing a method of manufacturing the multi-gate TFT 2' of FIG. 4B. As shown in FIGS. 5A to 5E, the multi-gate TFT 2' in the image display system is formed on the transparent substrate 20 by the processes of film deposition, development, exposure and etching.

Figure 5A:
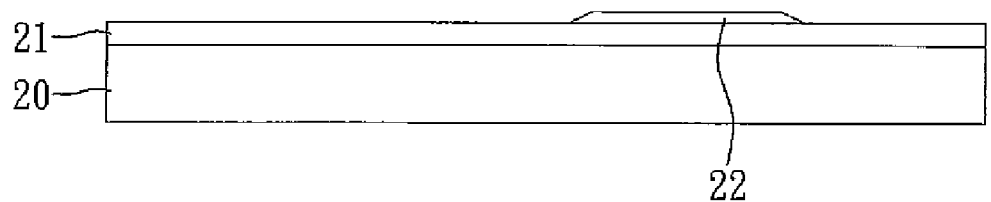
FIGS. 5A to 5E are schematic illustrations showing a method of manufacturing the multi-gate TFT of FIG. 4B.

As shown in FIG. 5A, an insulation material, such as silicon dioxide or silicon nitride is deposited on the transparent substrate 20 to form a buffer layer 21 to ensure that the transparent substrate 20 cannot directly contact the elements to be formed thereof. Then, a metal layer is further deposited on the buffer layer 21 and then patterned to form the reflecting layer 22 on the transparent substrate 20.

Figure 5B:
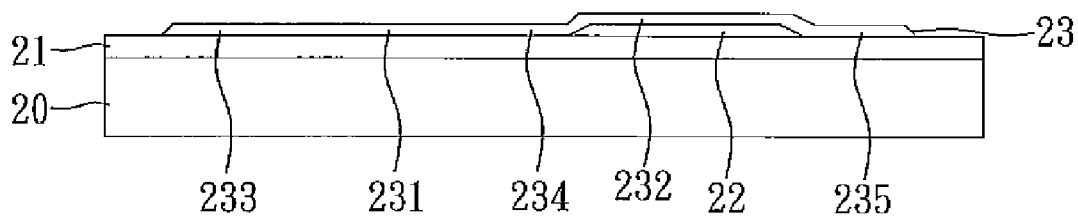

Next, as shown in FIG. 5B, a silicon film is deposited and patterned to define a portion necessary for the multi-gate TFT 2'. Thus, the silicon film layer 23 is formed on the buffer layer 21 and the reflecting layer 22 of the transparent substrate 20. The silicon film layer 23 has the first crystallization zone 231, the second crystallization zone 232, the first doped region 233, the second doped region 234 and the third doped region 235. The second crystallization zone 232 corresponds to the reflecting layer 22, the first doped region 233 is disposed near the first crystallization zone 231, the second doped region 234 is disposed between the first crystallization zone 231 and the second crystallization zone 232, and the third doped region 235 is disposed near the second crystallization zone 232. The first doped region 233, the second doped region 234 and the third doped region 235 are doped, and the first doped region 233 and the third doped region 235 respectively serve as the source and the drain of the multi-gate TFT 2'.

Figure 5C:
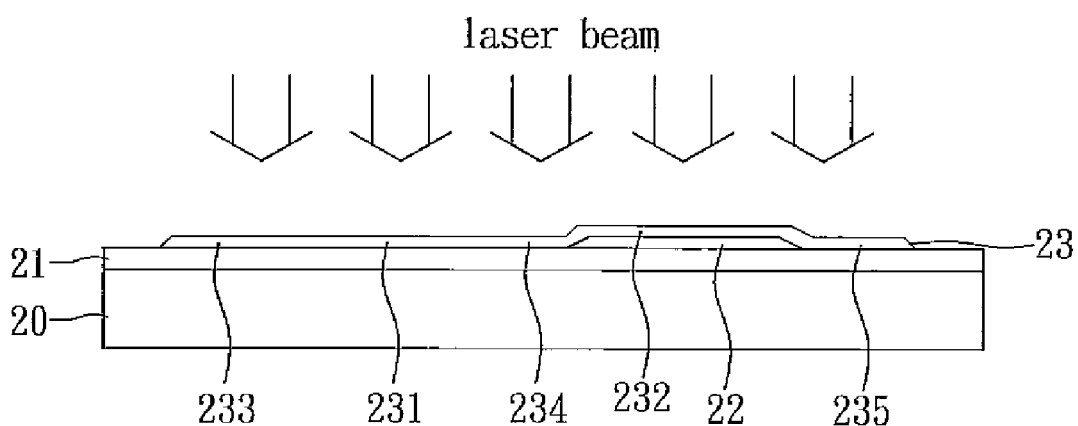

Then, as shown in FIG. 5C, a laser beam, such as a solid-state laser beam, having a wavelength longer than 400 nanometers is provided to illuminate the silicon film layer 23, wherein the silicon film layer 23 absorbs a portion of the laser beam and is then heated to melt so that the crystallization pattern of the silicon film layer 23 turns from the amorphous silicon into the polysilicon. Thus, the silicon film layer 23 can have better conductivity. In addition, the other portion of the laser beam penetrates through the second crystallization zone 232 of the silicon film layer 23 and is reflected from the reflecting layer 22 to the silicon film layer 23 so that the second crystallization zone 232 of the silicon film layer 23 absorbs the reflected laser beam and is thus heated to recrystallize. Thus, the grain size of the second crystallization zone 232 is larger than that of the first crystallization zone 231. After being illuminated by the laser beam, the silicon film layer 23 is kept stationary so that the temperature of the silicon film layer 23 is lowered down to the room temperature.

Figure 5D:
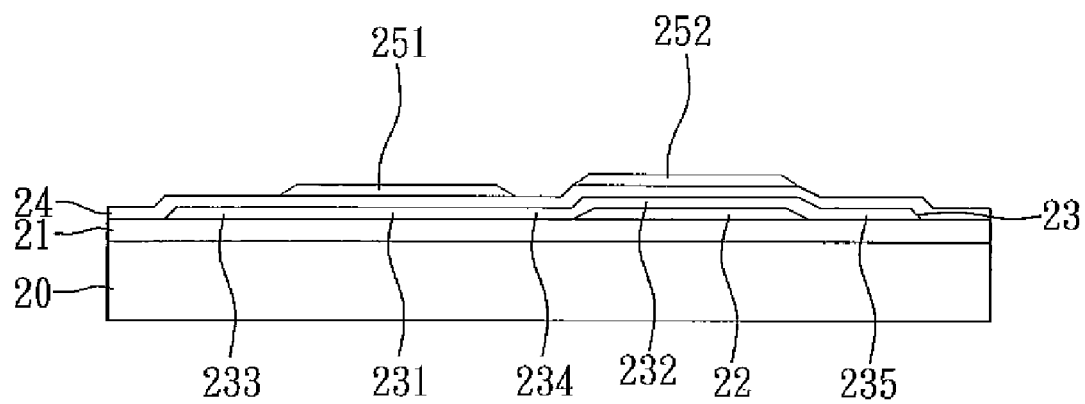

As shown in FIG. 5D, an insulation material is deposited to form the gate insulating layer 24 on the silicon film layer 23. Thereafter, a metal material is deposited and patterned to form the first electrode 251 and the second electrode 252 on the gate insulating layer 24. In the embodiment, the first electrode 251 and the second electrode 252 are formed corresponding to the first crystallization zone 231 and the second crystallization zone 232, respectively.

Figure 5E:
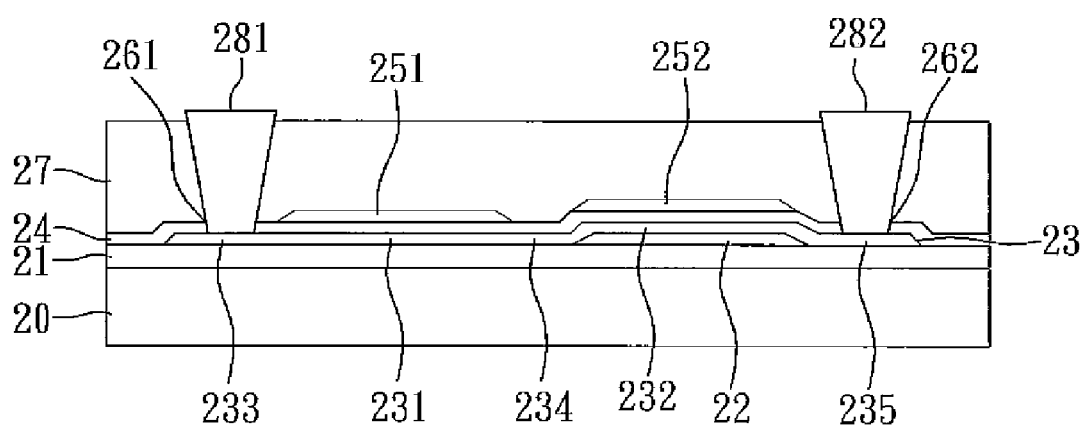

As shown in FIG. 5E, an insulation material is then deposited to form the insulating layer 27 on the first electrode 251 and the second electrode 252, and to form vias 261 and 262 and conductive electrodes 281 and 282. Thus, the multi-gate TFT 2' can be manufactured.

Figure 6:
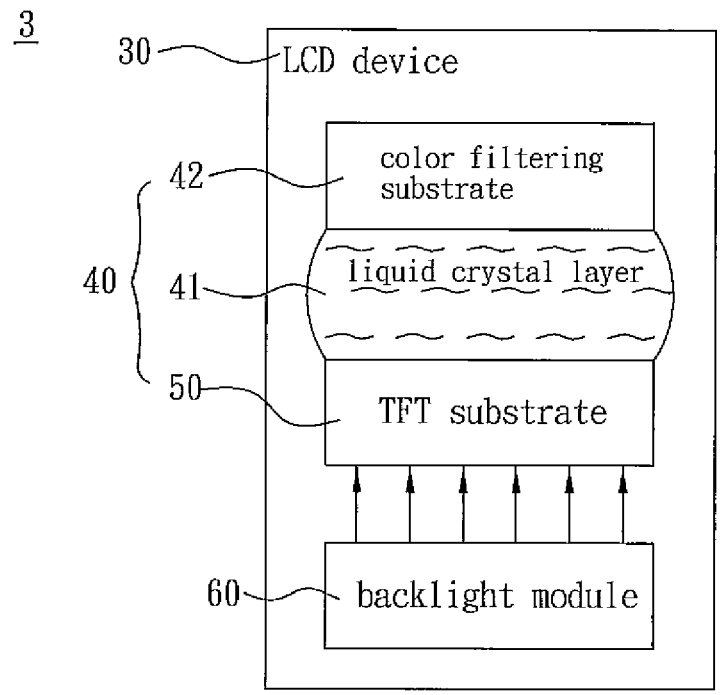
FIG. 6 is a schematic illustration showing a LCD device according to a preferred embodiment of the invention.

In addition, as shown in FIG. 6, an image display system 3 according to a preferred embodiment of the invention includes an active matrix display panel 40 having the transparent substrate and the multi-gate TFT of the above-mentioned embodiment.

In this embodiment, the active matrix display panel 40 is a LCD panel, and the active matrix display panel 40 and a backlight module 60 are assembled in a LCD device 30 of the image display system 3. The backlight module 60 is disposed on one side of the active matrix display panel 40.

The active matrix display panel 40 has a TFT substrate 50, a liquid crystal layer 41 and a color filtering substrate 42. The liquid crystal layer 41 is disposed between the TFT substrate 50 and the color filtering substrate 42. The TFT substrate 50 has the transparent substrate of the above-mentioned embodiment, and is defined with a plurality of pixels (not shown). A pixel electrode and the above-mentioned multi-gate TFT 2 or 2' are formed on each of the pixels. The pixel electrode is connected with the source of the TFT, and is made of a transparent conductive material, such as an indium tin oxide (ITO), through which the light penetrates to display the image.

The backlight module 60 serves as the light source of the LCD device 30 and provides the light, which penetrates through the TFT substrate 50, the liquid crystal layer 41 and the color filtering substrate 42 to display the frame to be watched by the user.

In addition, the active matrix display panel 40 is applied to the conventional TN-type transmissive LCD device 30. In another embodiment, the liquid crystal alignment method in the active matrix display panel may pertain to the conventional twisted nematic (TN) type, a multi-domain vertical alignment (MVA) type, an in-plane switching (IPS) type or a fringe-field switching (FFS) type. Furthermore, the color filter of the active matrix display panel may also be integrated in the TFT substrate to constitute a color filter on array (COA). The active matrix display panel in the LCD device may also be replaced with the LCD panels mentioned hereinabove.

In another embodiment, a light reflecting plate may also be disposed on the TFT substrate of the active matrix display panel, and the light may enter the active matrix display panel from the outside. Then, the light penetrates through the liquid crystal layer and is then reflected by the reflecting plate. The reflected light again penetrates through the liquid crystal layer to display the image. This active matrix display panel is the reflective LCD panel. A transflective LCD panel may be obtained if the transmissive and reflective display methods are combined. The active matrix display panel in the LCD device can be replaced by the LCD panels mentioned hereinabove. It is to be specified that the reflective LCD device does not need a backlight module.

In another embodiment, the active matrix display panel may be an organic light emitting diode (OLED) panel and further includes an organic light emitting diode to be driven by a multi-gate TFT.

Figure 7:
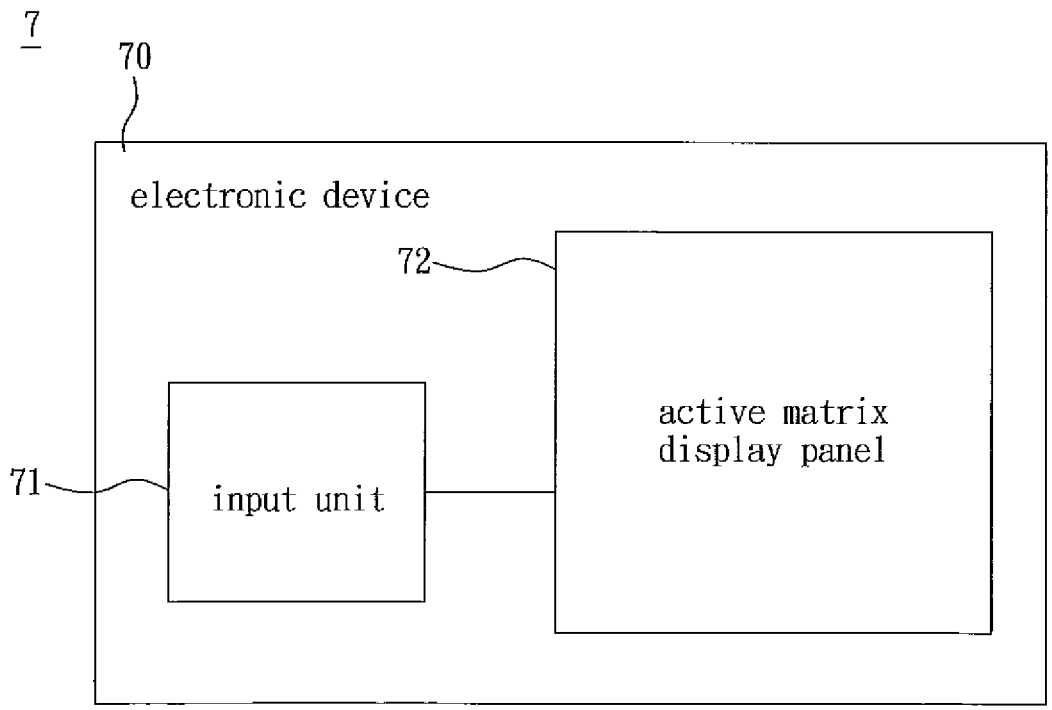
FIG. 7 is a schematic illustration showing an image display system according to a preferred embodiment of the invention.

In addition, referring to FIG. 7, an image display system 7 further includes an electronic device 70 having an active matrix display panel 72 and an input unit 71. The active matrix display panel 72 may be the MVA, IPS, FFS, COA, transmissive or transflective LCD panel mentioned hereinabove. The input unit 71 is coupled with the active matrix display panel 72 and provides an input to the active matrix display panel 72 to make the active matrix display panel 72 display an image. The electronic device 70 of this embodiment may be, for example, a mobile phone a digital camera, a personal digital assistant, a notebook computer, a desktop computer, a television, a vehicle display or a portable DVD player.

In summary, in the image display system and the method of manufacturing the multi-gate TFT according to the invention, the second crystallization zone has better conductivity than the first crystallization zone and the second crystallization zone has smaller equivalent resistance than the first crystallization zone. So, when the multi-gate TFT operates, the same current flows through the second crystallization zone and the first crystallization zone. However, the second crystallization zone has the smaller potential difference than the first crystallization zone, so that the kink current generated in the second crystallization zone can be reduced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An image display system having a multi-gate thin-film transistor (TFT) disposed on a transparent substrate, wherein the multi-gate TFT comprises:
   a silicon film layer, which is formed on the transparent substrate and has a first crystallization zone and a second crystallization zone that are not adjacent to each other, wherein a grain size of the first crystallization zone is smaller than a grain size of the second crystallization zone;
   a first electrode, which corresponds to the first crystallization zone and is disposed on the silicon film layer; and
   a reflecting layer, which corresponds to the second crystallization zone and is disposed on the transparent substrate, wherein the silicon film layer is disposed on the transparent substrate and the reflecting layer.

2. The system according to claim 1, wherein the grain size of the second crystallization zone is formed by absorbing a laser beam and a reflected laser beam.

3. The system according to claim 1, wherein the multi-gate TFT further comprises:
   a second electrode, which corresponds to the second crystallization zone and is disposed on the silicon film layer.

4. The system according to claim 3, wherein the first electrode serves as a gate of a first sub-TFT, and the second electrode serves as a gate of a second sub-TFT.

5. The system according to claim 3, wherein the first electrode serves as a gate of a first sub-TFT, and the second electrode and the reflecting layer serve as a gate of a second sub-TFT.

6. The system according to claim 1, wherein the first electrode serves as a gate of a first sub-TFT, and the reflecting layer serves as a gate of a second sub-TFT.

7. The system according to claim 6, wherein the first sub-TFT operates in an active region, and the second sub-TFT operates in a saturation region.

8. The system according to claim 7, wherein a width-to-length ratio of a channel region of the first sub-TFT is smaller than a width-to-length ratio of a channel region of the second sub-TFT.

9. The system according to claim 1, wherein the reflecting layer has a thickness greater than 100 angstroms.

10. The system according to claim 1, wherein a length of the first crystallization zone is longer than a length of the second crystallization zone.

11. The system according to claim 1, wherein the multi-gate TFT further comprises:
- a buffer layer disposed on the transparent substrate, wherein the silicon film layer is disposed on the buffer layer; and
- a gate insulating layer disposed on the silicon film layer, wherein the first electrode is disposed on the gate insulating layer.

12. The system according to claim 1, wherein the silicon film layer further comprises:
- a first doped region disposed near the first crystallization zone to serve as a source of the multi-gate TFT;
- a second doped region disposed between the first crystallization zone and the second crystallization zone; and
- a third doped region disposed near the second crystallization zone to serve as a drain of the multi-gate TFT.

13. The system according to claim 1, further comprising:
an active matrix display panel having the transparent substrate and the multi-gate TFT.

14. The system according to claim 13, further comprising:
an electronic device having the active matrix display panel and an input unit coupled with the active matrix display panel, wherein the input unit provides an input for the active matrix display panel to make the active matrix display panel display an image.

15. The system according to claim 14, wherein the electronic device is a mobile phone, a digital camera, a personal digital assistant, a notebook computer, a desktop computer, a television, a vehicle display or a portable DVD player.

* * * * *